United States Patent
Chen

(10) Patent No.: US 11,038,505 B2
(45) Date of Patent: Jun. 15, 2021

(54) SWITCH CONTROL CIRCUIT AND SWITCH CIRCUIT

(71) Applicant: REALTEK SEMICONDUCTOR CORPORATION, Hsinchu (TW)

(72) Inventor: Leaf Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/900,203

(22) Filed: Jun. 12, 2020

(65) Prior Publication Data

US 2020/0395934 A1 Dec. 17, 2020

(30) Foreign Application Priority Data

Jun. 17, 2019 (TW) .................................. 108120910

(51) Int. Cl.
*H03K 17/687* (2006.01)

(52) U.S. Cl.
CPC ................ *H03K 17/6871* (2013.01)

(58) Field of Classification Search
CPC ............. H03K 17/6871; H03K 2017/066
USPC .................................................. 327/108–112
See application file for complete search history.

(56) References Cited

U.S. PATENT DOCUMENTS

| | | | | |
|---|---|---|---|---|
| 10,720,913 B1* | 7/2020 | Leong | .................. | H03K 17/063 |
| 2003/0149902 A1* | 8/2003 | Silla | ..................... | G11C 11/417 |
| | | | | 713/300 |
| 2019/0149146 A1* | 5/2019 | Tang | ..................... | H03K 17/223 |
| | | | | 327/109 |
| 2019/0149150 A1* | 5/2019 | Bondade | .............. | H03K 17/165 |
| | | | | 327/109 |
| 2019/0199193 A1* | 6/2019 | Gloes | .................... | H02M 7/538 |
| 2019/0372567 A1* | 12/2019 | Yoshida | ............. | H03K 17/0828 |
| 2020/0135722 A1* | 4/2020 | Chern | ................ | H01L 29/66462 |
| 2020/0395934 A1* | 12/2020 | Chen | .................. | H03K 17/6871 |

FOREIGN PATENT DOCUMENTS

TW 201427212 7/2014

OTHER PUBLICATIONS

Taiwan Intellectual Property Office, Office Action letter of the counterpart TW application (appl. No. 108120910) dated Dec. 13, 2019. English summary on p. 1.

* cited by examiner

*Primary Examiner* — Adam D Houston
(74) *Attorney, Agent, or Firm* — WPAT, PC

(57) ABSTRACT

Disclosed is a switch control circuit coupled between a switch control node and a voltage terminal. The switch control node is between an input circuit and a switch. The switch control circuit includes: an electronic component being turned on or off according to voltages of the switch control node and a control voltage node in a power-on state and preventing the voltage of the switch control node from being higher than a predetermined voltage in a power-off state; a control circuit outputting a control signal to the control voltage node in the power-on state and having no effective control over the voltage of the control voltage node in the power-off state; and a resistive component coupled between the control voltage node and voltage terminal. The electronic and resistive components function as at least a part of a leakage path to assist in turning off the switch in the power-off state.

20 Claims, 8 Drawing Sheets

SWITCH CONTROL CIRCUIT AND SWITCH CIRCUIT

BACKGROUND OF THE INVENTION

1. Field of the Invention

The present invention relates to a switch, especially to a switch control circuit and a switch circuit used in an integrated circuit.

2. Description of Related Art

FIG. 1 shows a conventional switch circuit. The switch circuit 100 of FIG. 1 includes a switch control circuit 110 and an NMOS transistor switch 120. The NMOS transistor switch 120 is coupled between two nodes and the electric characteristics of the two nodes are dependent on the configuration of a circuit including the switch circuit 100. In a power-on state the control circuit 110 can output a low voltage to turn off the NMOS transistor switch 120; however, in a power-off state the control circuit 110 cannot output the low voltage certainly and therefore the NMOS transistor switch 120 cannot be turned off for sure.

FIG. 2 shows another conventional switch circuit. The switch circuit 200 of FIG. 2 includes a control circuit 210, an NMOS transistor switch 220, a constant resistor 230, and a ground terminal 240. The difference between FIG. 2 and FIG. 1 is the constant resistor 230 functions as a leakage path between the NMOS transistor switch 220 and the ground terminal 240. Accordingly, in the power-off state the gate voltage of the NMOS transistor switch 220 is pulled down to the voltage of the ground terminal 240 and thus the NMOS transistor switch 120 can be turned off for sure. Unfortunately, in the power-on state the constant resistor 230 will be a burden to the operating speed of the switch circuit 200 and drag the performance of the switch circuit 200 down.

SUMMARY OF THE INVENTION

An object of the present disclosure is to provide a switch control circuit and a switch circuit as improvements over the prior arts.

According to an embodiment of the switch control circuit of the present disclosure, the switch control circuit is coupled between a switch control node and a voltage terminal. The switch control node is between an input circuit and a switch. The switch control circuit is operable to control the switch and includes an electronic component, a control circuit, and a resistive component. The electronic component is coupled between the switch control node and a control voltage node, configured to be turned on or off according to the voltage of the control voltage node in a power-on state, and configured to prevent the voltage of the switch control node from being higher than a predetermined voltage in a power-off state. The control circuit is configured to output a control signal to the control voltage node in the power-on state and has no effective control over the voltage of the control voltage node in the power-off state. The resistive component is coupled between the control voltage node and the voltage terminal. The electronic component and the resistive component function as at least a part of a leakage path between the switch control node and the voltage terminal and thereby assist in turning off the switch in the power-off state. In an exemplary implementation, the predetermined voltage is equal to the sum of the voltage drop caused by the electronic component between the switch control node and the control voltage node and the voltage of the voltage terminal in the power-off state.

An embodiment of the switch circuit of the present disclosure includes an input circuit, a switch, and a switch control circuit. The input circuit is operable to output a switch control signal to a switch control node in a power-on state and has no effective control over the voltage of the switch control node in a power-off state. The switch is configured to be turned on or off according to the voltage of the switch control node, wherein the switch control node is between the input circuit and the switch. The switch control circuit is coupled between the switch control node and a voltage terminal and configured to control the switch in conjunction with the input circuit. The switch control circuit includes an electronic component, a control circuit, and a resistive component. The electronic component is coupled between the switch control node and a control voltage node, configured to be turned on or off according to the voltages of the switch control node and the control voltage node in the power-on state, and configured to prevent the voltage of the switch control node from being higher than a predetermined voltage in the power-off state. The control circuit is configured to output a control signal to the control voltage node in the power-on state and has no effective control over the voltage of the control voltage node in the power-off state. The resistive component is coupled between the control voltage node and the voltage terminal, and the electronic component and the resistive component function as at least a part of a leakage path between the switch control node and the voltage terminal and thereby assist in turning off the switch in the power-off state. In an exemplary implementation, the predetermined voltage is equal to the sum of the voltage drop caused by the electronic component between the switch control node and the control voltage node and the voltage of the voltage terminal in the power-off state.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure includes a switch control circuit and a switch circuit that can ensure the switch of the switch circuit being turned off in a power-off state, while not significantly impacting the performance of the switch circuit in a power-on state.

Figure 1:
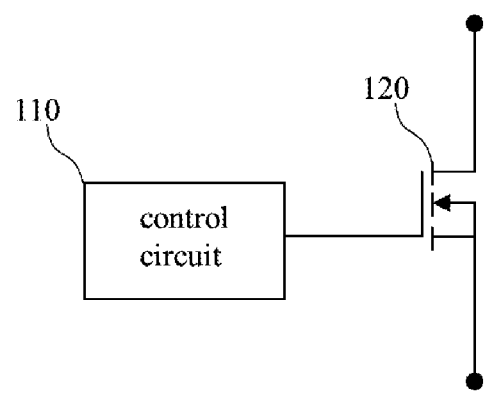
FIG. 1 shows a conventional switch circuit.
Figure 2:
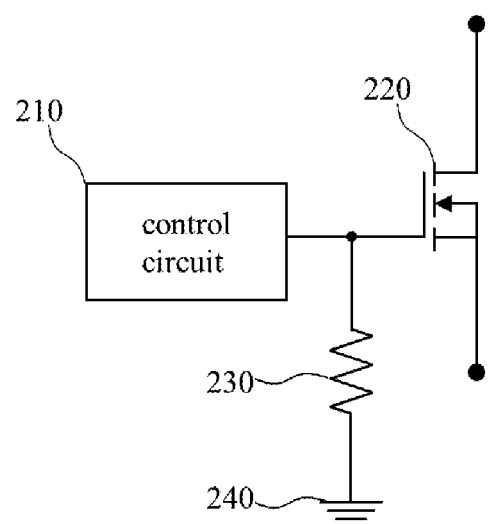
FIG. 2 shows another conventional switch circuit.
Figure 3:
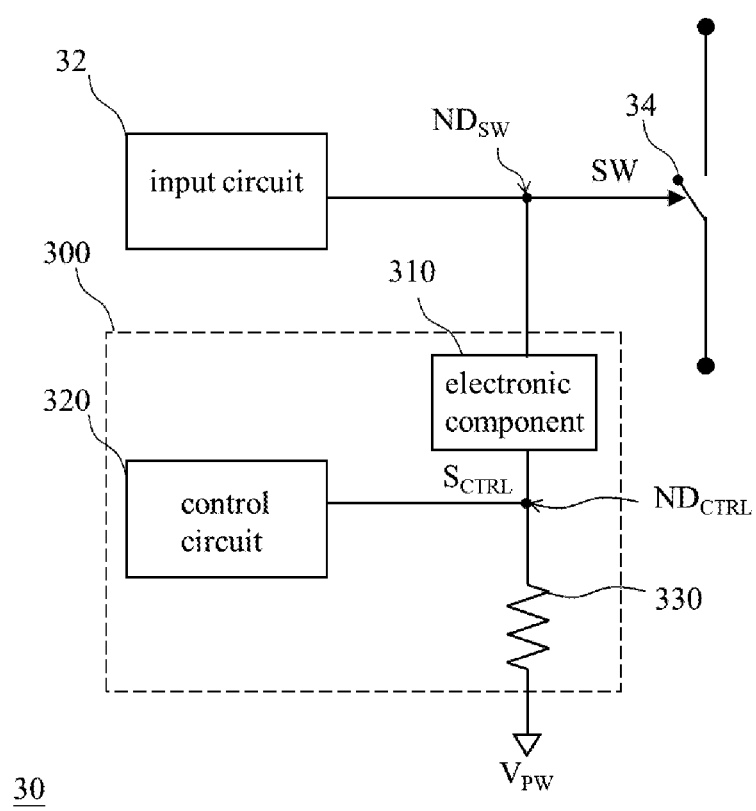
FIG. 3 shows an embodiment of the switch circuit of the present disclosure.

FIG. 3 shows an embodiment of the switch circuit of the present disclosure. The switch circuit 30 includes an input circuit 32, a switch 34, and a switch control circuit 300. The switch control circuit 300 can be implemented without the input circuit 32 and the switch 34 and used to control a switch of an integrated circuit.

Please refer to FIG. 3. The input circuit 32 is configured to output a switch control signal SW to a switch control node $ND_{SW}$ for controlling a voltage $V_{SW}$ of the switch control node $ND_{SW}$ in a power-on state, and has no effective control over the voltage $V_{SW}$ of the switch control node $ND_{SW}$ in a power-off state; the switch control node $ND_{SW}$ is between the input circuit 32 and the switch 34; the power-on state is a circumstance that power is normally supplied to the input circuit 32 (i.e., a circumstance that the input circuit 32 can control the switch 34 with the switch control signal SW); and the power-off state is a circumstance that power is not supplied to the input circuit 32 or abnormally supplied to the input circuit 32 (i.e., a circumstance that the input circuit 32 cannot effectively control the switch 34 with the switch control signal SW). In an exemplary implementation of the embodiment of FIG. 3, the input circuit 32 stops operating and/or has no effective control of the switch control signal SW in the power-off state and thereby it is incapable of controlling the voltage $V_{SW}$ of the switch control node $ND_{SW}$. In an exemplary implementation of the embodiment of FIG. 3, the input circuit 32 is a known or self-developed circuit such as a charge pump, a voltage source, an inverter, or any circuit capable of turning on and off the switch 34 in the power-on state.

Figure 4:
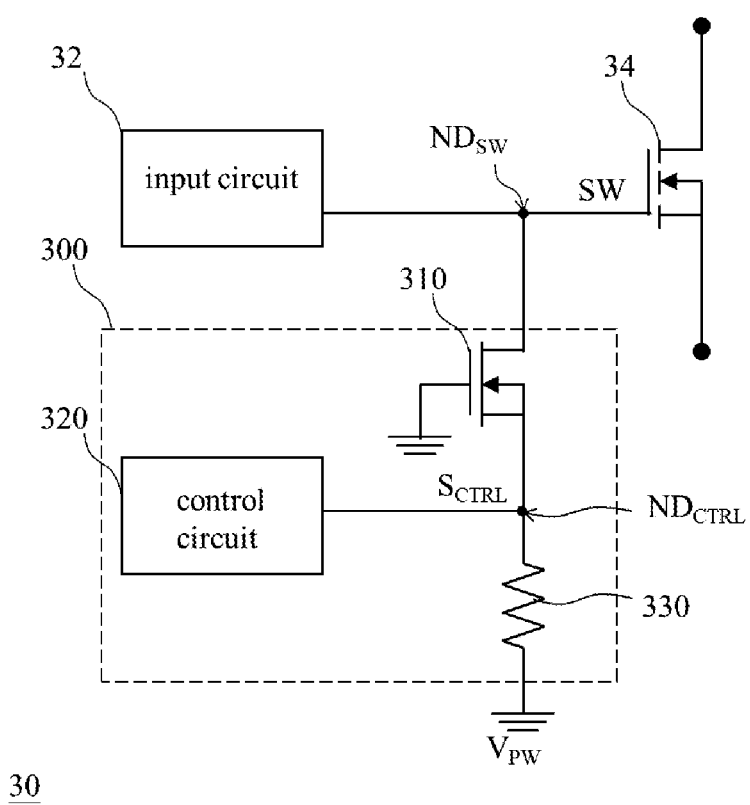
FIG. 4 shows an embodiment of the electronic component of FIG. 3.

Please refer to FIG. 3. The switch 34 is coupled between two terminals. The electric characteristics of the two terminals are dependent on the circuit configuration to which the switch circuit 30 is applied. The switch 34 is configured to be turned on or off according to the switch control signal SW in the power-on state and to be turned on or off according to the control of the switch control circuit 300 in the power-off state, wherein the switch control circuit 300 is coupled between the switch control node $ND_{SW}$ and a voltage terminal $V_{PW}$. In an exemplary implementation of the embodiment of FIG. 3, the switch 34 is or includes an enhancement mode NMOS transistor as shown in FIG. 4 and the voltage terminal $V_{PW}$ is a low voltage terminal such as a ground terminal.

Please refer to FIG. 3. The switch control circuit 300 includes an electronic component 310, a control circuit 320, and a resistive component 330. The electronic component 310 is coupled between the switch control node $ND_{SW}$ and a control voltage node $ND_{CTRL}$ and configured to be turned on or off according to the voltage $V_{SW}$ of the switch control node $ND_{SW}$ and the voltage $V_{CTRL}$ of the control voltage node $ND_{CTRL}$; in other words, the conducting state of the electronic component 310 is determined by the voltage $V_{SW}$ and the voltage $V_{CTRL}$. The electronic component 310 is also configured to prevent the voltage $V_{SW}$ of the switch control node $ND_{SW}$ from being higher than a predetermined voltage in the power-off state. In an exemplary implementation of the embodiment of FIG. 3, the predetermined voltage is equal to the sum of the voltage drop (e.g., a threshold voltage for the electronic component 310 being electrically conductive) caused by the electronic component between the switch control node $ND_{SW}$ and the control voltage node $ND_{CTRL}$ and the voltage of the voltage terminal $V_{PW}$ in the power-off state.

Please refer to FIG. 3. The control circuit 320 is configured to output a control signal $S_{CTRL}$ to the control voltage node $ND_{CTRL}$ for controlling the voltage $V_{CTRL}$ of the control voltage node in the power-on state, and has no effective control over the voltage $V_{CTRL}$ of the control voltage node $ND_{CTRL}$ in the power-off state. In an exemplary implementation of the embodiment of FIG. 3, the control circuit 320 stops operating and/or has no effective control of the control signal $S_{CTRL}$ in the power-off state and thereby it is incapable of controlling the voltage $V_{CTRL}$ of the control voltage node $ND_{CTRL}$.

Please refer to FIG. 3. The resistive component 330 is coupled between the control voltage node $ND_{CTRL}$ and the voltage terminal $V_{PW}$, and the resistive component 330 and the electronic component 310 function as at least a part of a leakage path between the switch control node $ND_{SW}$ and the voltage terminal $V_{PW}$. In an exemplary implementation of the embodiment of FIG. 3, the voltage $V_{CTRL}$ of the control voltage node $ND_{CTRL}$ is equal/similar to the voltage of the voltage terminal $V_{PW}$ in the power-off state.

FIG. 4 shows an embodiment of the electronic component 310 of FIG. 3. As shown in FIG. 4, the electronic component 310 is a depletion mode NMOS transistor. The gate terminal of the depletion mode NMOS transistor is coupled to a low voltage terminal (e.g., a ground terminal); therefore the conducting channel of the depletion mode NMOS transistor remains alive in the power-off state, and this pulls the voltage $V_{SW}$ of the switch control node $ND_{SW}$ down to the voltage of the voltage terminal $V_{PW}$ and consequently the switch 34 can be certainly turned off in the power-off state. In the power-on state the control circuit 320 is configured to properly control the voltage $V_{CTRL}$ of the control voltage node $ND_{CTRL}$ so as to control the drain-to-source voltage (i.e., $|V_{SW}-V_{CTRL}|$) of the depletion mode NMOS transistor; in this way the amount of current flowing through the depletion mode NMOS transistor is well controlled to reduce/minimize the influence on the operation of the switch circuit 30 or allow at least a part of the switch circuit 30 (e.g., the input circuit 32 of the switch circuit 30) to slightly discharge. It should be noted that since people of ordinary skill in the art can use a depletion mode PMOS transistor as the electronic component 310 instead and appreciate the way to modify the configuration of the switch control circuit 300 according to the present disclosure, repeated and redundant description is omitted here.

Figure 5:
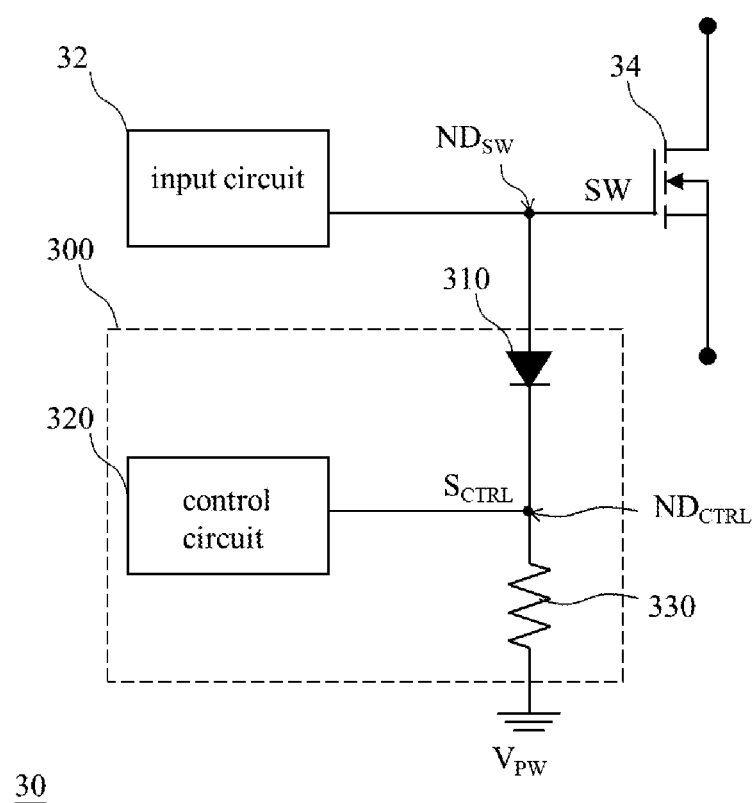
FIG. 5 shows another embodiment of the electronic component of FIG. 3.

FIG. 5 shows another embodiment of the electronic component 310 of FIG. 3. As shown in FIG. 5, the electronic component 310 is a diode. The threshold voltage of the diode is $V_{th}$. Accordingly, in the power-off state the voltage $V_{SW}$ of the switch control node $ND_{SW}$ will be equal to the threshold voltage $V_{th}$ of the diode plus the voltage of the voltage terminal $V_{PW}$. By choosing a diode with a proper threshold voltage $V_{th}$, the switch 34 can be turned off in the power-off state. In addition, in the power-on state the control circuit 320 is configured to control the voltage $V_{CTRL}$ of the control voltage node $ND_{CTRL}$ to turn off the diode, which prevents the operation of the switch circuit 30 from being improperly affected. Moreover, the control circuit 320 can slightly turn on the diode by controlling the voltage $V_{CTRL}$ of the control voltage node $ND_{CTRL}$ and thereby adjust the voltage $V_{SW}$ of the switch control node $ND_{SW}$.

Figure 6:
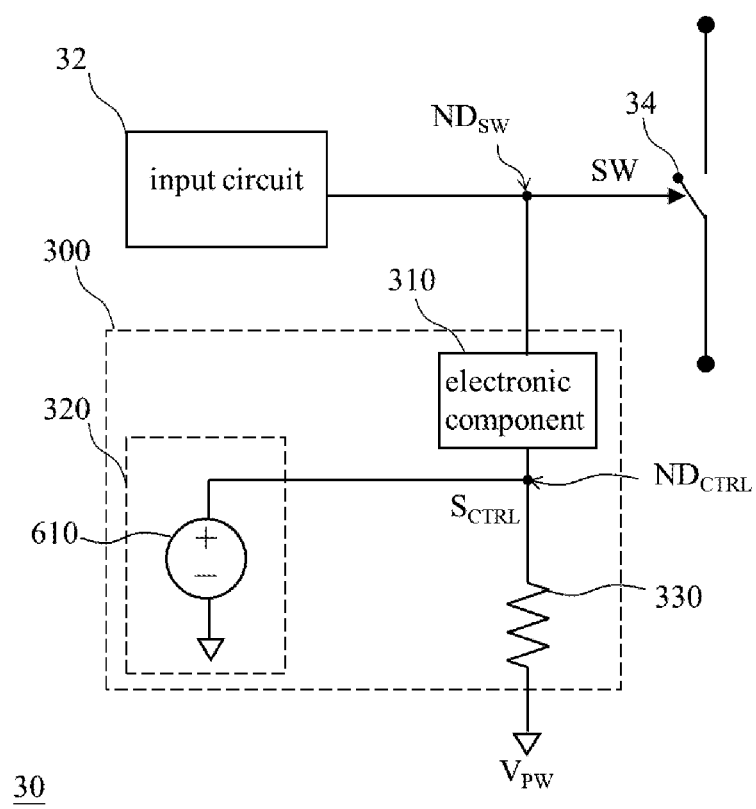
FIG. 6 shows an embodiment of the control circuit of FIG. 3.

FIG. 6 shows an embodiment of the control circuit 320 of FIG. 3. As shown in FIG. 6, the control circuit 320 includes a voltage source 610 such as a constant voltage source or an adjustable voltage source; accordingly, the control signal $S_{CTRL}$ is a controlled voltage used to determine the voltage $V_{CTRL}$ ($V_{CTRL}=S_{CTRL}$) of the control voltage node $ND_{CTRL}$. In the embodiment of FIG. 6, the resistive component 330 is a constant resistor or an adjustable resistor. When the resistive component 330 is adjustable, the current flowing through the control voltage node $ND_{CTRL}$ can be controlled by the adjustment of the resistive component 330. It should be noted that those having ordinary skill in the art can use at least one field effect transistor (FET) as a voltage-controlled resistor or use other kinds of integrated or discrete resistors to implement the resistive component 330.

Figure 7:
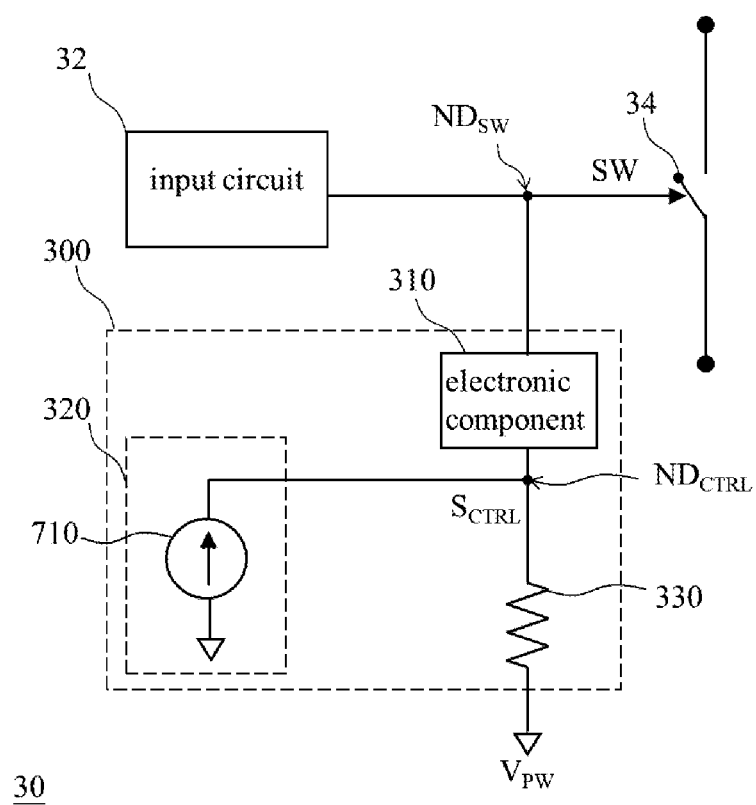
FIG. 7 shows another embodiment of the control circuit of FIG. 3.

FIG. 7 shows another embodiment of the control circuit 320 of FIG. 3. As shown in FIG. 7, the control circuit 320 includes a current source 710 such as a constant current source or an adjustable current source; accordingly, the control signal $S_{CTRL}$ is a controlled current used to determine the voltage $V_{CTRL}$ ($V_{CTRL}=S_{CTRL}\times R$, wherein R is the resistance of the resistive component 330) of the control voltage node $ND_{CTRL}$ in conjunction with resistive component 330. In the embodiment of FIG. 7, the resistive component 330 is a constant resistor or an adjustable resistor. When the resistive component 330 is adjustable, the voltage $V_{CTRL}$ of the control voltage node $ND_{CTRL}$ can be controlled by the adjustment of the resistive component 330.

Figure 8:
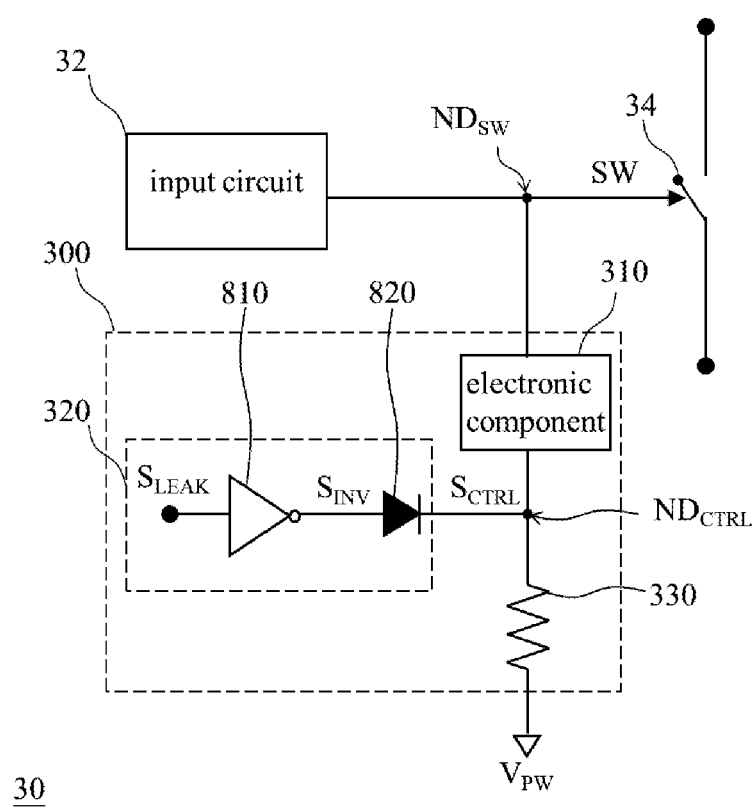
FIG. 8 shows yet another embodiment of the control circuit of FIG. 3.

FIG. 8 shows yet another embodiment of the control circuit 320 of FIG. 3. As shown in FIG. 8, the control circuit 320 includes an inverter 810 and a diode 820, wherein the diode 820 can be optionally omitted. Providing the diode 820 is included in the control circuit 320, the diode 820 can block the leakage path between the control voltage node $ND_{CTRL}$ and the inverter 810 in the power-on state; and providing the diode 820 is omitted, the bias for the inverter 810 can be properly set in the power-on state so as to block the leakage path between the control voltage node $ND_{CTRL}$ and the inverter 810. The inverter 810 is configured to receive a leakage control signal $S_{LEAK}$ and thereby output an inversed signal $S_{INV}$. The diode 820 is coupled between the inverter 810 and the control voltage node $ND_{CTRL}$ and configured to output the control signal $S_{CTRL}$ to the control voltage node $ND_{CTRL}$ according to the inversed signal $S_{INV}$.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the switch control circuit and the switch circuit of the present disclosure can certainly turn off the switch of the switch circuit in the power-off state and have no significant negative influence on the performance of the switch circuit in the power-on state; actually, the performance of the switch circuit can even be improved.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A switch control circuit, the switch control circuit being coupled between a switch control node and a voltage terminal, the switch control node being between an input circuit and a switch, the switch control circuit being capable of controlling the switch and comprising:
   a control circuit configured to output a control signal to a control voltage node for controlling a voltage of the control voltage node in a power-on state and configured to have no effective control over the voltage of the control voltage node in a power-off state;
   an electronic component coupled between the switch control node and the control voltage node, configured to be turned on or off according to the voltage of the control voltage node in the power-on state, and configured to prevent a voltage of the switch control node from being higher than a predetermined voltage in the power-off state; and
   a resistive component coupled between the control voltage node and the voltage terminal,
   wherein the electronic component and the resistive component function as at least a part of a leakage path between the switch control node and the voltage terminal, thereby assisting in turning off the switch in the power-off state.

2. The switch control circuit of claim 1, wherein the electronic component is a depletion mode transistor and the predetermined voltage is equal to a voltage of the voltage terminal.

3. The switch control circuit of claim 2, wherein a gate voltage of the depletion mode transistor is equal to the voltage of the voltage terminal.

4. The switch control circuit of claim 1, wherein the electronic component is a diode and the predetermined voltage is not lower than a voltage of the voltage terminal plus a threshold voltage of the diode.

5. The switch control circuit of claim 1, wherein the voltage terminal is a low voltage terminal and the electronic component is a depletion mode NMOS transistor.

6. The switch control circuit of claim 1, wherein the voltage terminal is a high voltage terminal and the electronic component is a depletion mode PMOS transistor.

7. The switch control circuit of claim 1, wherein the control circuit is an adjustable voltage source.

8. The switch control circuit of claim 1, wherein the control circuit is an adjustable current source.

9. The switch control circuit of claim 1, wherein the control circuit is a current source and the resistive component is an adjustable resistor.

10. The switch control circuit of claim 1, wherein the control circuit includes:
    an inverter configured to receive a leakage control signal and accordingly output an inverse signal; and
    a diode coupled between the inverter and the control voltage node and configured to output the control signal to the control voltage node according to the inverse signal.

11. A switch circuit, comprising:
    an input circuit configured to output a switch control signal to a switch control node for controlling a voltage of the switch control node in a power-on state and having no effective control over the voltage of the switch control node in a power-off state;
    a switch configured to be turned on or off according to the voltage of the switch control node, wherein the switch control node is between the input circuit and the switch; and
    a switch control circuit being coupled between the switch control node and a voltage terminal and including:
       a control circuit being configured to output a control signal to a control voltage node for controlling a voltage of the control voltage node in the power-on state and having no effective control over the voltage of the control voltage node in the power-off state;
       an electronic component coupled between the switch control node and the control voltage node, configured to be turned on or off according to the voltage of the switch control node and the voltage of the control voltage node in the power-on state, and configured to prevent the voltage of the switch control node from being higher than a predetermined voltage in the power-off state; and a resistive component coupled between the control voltage node and the voltage terminal, wherein the electronic component and the resistive component function as at least a part of a leakage path between the switch control node and the voltage terminal, thereby assisting in turning off the switch in the power-off state.

12. The switch circuit of claim 11, wherein the electronic component is a depletion mode transistor and the predetermined voltage is equal to a voltage of the voltage terminal.

13. The switch circuit of claim 12, wherein a gate voltage of the depletion mode transistor is equal to the voltage of the voltage terminal.

14. The switch circuit of claim 11, wherein the electronic component is a diode and the predetermined voltage is equal to a voltage of the voltage terminal plus a threshold voltage of the diode.

15. The switch circuit of claim 11, wherein the voltage terminal is a low voltage terminal, the switch is an enhancement mode NMOS transistor, and the electronic component is a depletion mode NMOS transistor.

16. The switch circuit of claim 11, wherein the voltage terminal is a high voltage terminal, the switch is an enhancement mode PMOS transistor, and the electronic component is a depletion mode PMOS transistor.

17. The switch circuit of claim 11, wherein the control circuit is an adjustable voltage source.

18. The switch circuit of claim 11, wherein the control circuit is an adjustable current source.

19. The switch circuit of claim 11, wherein the control circuit is a current source and the resistive component is an adjustable resistor.

20. The switch circuit of claim 11, wherein the control circuit includes:

an inverter configured to receive a leakage control signal and accordingly output an inverse signal; and a diode coupled between the inverter and the control voltage node and configured to output the control signal to the control voltage node according to the inverse signal.

\* \* \* \* \*